(12) United States Patent
Zhao et al.

(10) Patent No.: US 9,112,020 B2
(45) Date of Patent: Aug. 18, 2015

(54) TRANSISTOR DEVICE

(71) Applicant: Semiconductor Manufacturing International Corp, Shanghai (CN)

(72) Inventors: Neil Zhao, Shanghai (CN); Mieno Fumitake, Shanghai (CN)

(73) Assignee: SEMICONDUCTOR MANUFACTURING INTERNATIONAL CORP, Shanghai (CN)

( * ) Notice: Subject to any disclaimer, the term of this patent is extended or adjusted under 35 U.S.C. 154(b) by 0 days.

(21) Appl. No.: 14/607,741

(22) Filed: Jan. 28, 2015

(65) Prior Publication Data

US 2015/0137146 A1    May 21, 2015

Related U.S. Application Data

(62) Division of application No. 13/686,163, filed on Nov. 27, 2012, now Pat. No. 8,975,642.

(30) Foreign Application Priority Data

Jul. 12, 2012 (CN) .......................... 2012-10241515

(51) Int. Cl.
    H01L 29/15    (2006.01)
    H01L 29/78    (2006.01)
    H01L 29/16    (2006.01)
    H01L 29/161   (2006.01)
    H01L 29/165   (2006.01)

(52) U.S. Cl.
    CPC .............. *H01L 29/78* (2013.01); *H01L 29/161* (2013.01); *H01L 29/165* (2013.01); *H01L 29/1608* (2013.01)

(58) Field of Classification Search
    CPC .... H01L 29/1608; H01L 29/161; H01L 29/16
    USPC ......................................................... 257/77
    See application file for complete search history.

(56) References Cited

U.S. PATENT DOCUMENTS

| 7,687,356 | B2 | 3/2010 | Coronel et al. |
| 8,975,130 | B2 * | 3/2015 | Ciavatti et al. ................ 438/202 |
| 2007/0117282 | A1 | 5/2007 | Saito et al. |
| 2009/0283842 | A1 * | 11/2009 | Hokazono ...................... 257/392 |
| 2013/0062670 | A1 | 3/2013 | Wong et al. |

* cited by examiner

*Primary Examiner* — Ajay K Arora
(74) *Attorney, Agent, or Firm* — Anova Law Group, PLLC

(57) ABSTRACT

Various embodiments provide transistor devices and fabrication methods. An exemplary transistor device with improved carrier mobility can be formed by first forming a confining layer on a semiconductor substrate to confine impurity ions diffused from the semiconductor substrate to the confining layer. An epitaxial silicon layer can be formed on the confining layer, followed by forming a gate structure on the epitaxial silicon layer. A portion of the epitaxial silicon layer can be used as an intrinsic channel region. A source region and a drain region can be formed in portions of each of the epitaxial silicon layer, the confining layer, and the semiconductor substrate.

8 Claims, 10 Drawing Sheets

TRANSISTOR DEVICE

CROSS REFERENCE TO RELATED APPLICATIONS

This application is a divisional of U.S. patent application Ser. No. 13/686,163, filed on Nov. 27, 2012, which claims priority to Chinese Patent Application No. 201210241515.1, filed on Jul. 12, 2012, all of which are incorporated herein by reference in their entirety.

FIELD OF THE DISCLOSURE

The present disclosure relates to the field of semiconductor technology and, more particularly, relates to transistor devices and their fabrication methods.

BACKGROUND

Metal-oxide-semiconductor (MOS) transistors are of the basic devices in semiconductor manufacturing and are widely used in integrated circuits (ICs). Depending on the doping type, MOS transistors include NMOS and PMOS transistors.

FIGS. 1-3 show cross-sectional structures of a conventional transistor during its formation. As shown in FIG. 1, a well region 101 is formed in a semiconductor substrate 100 by ion implantation. A gate structure is formed on surface of the semiconductor substrate 100. The gate structure includes a gate electrode 103 on a gate oxide layer 102. The gate oxide layer 102 is disposed on the semiconductor substrate 100.

As shown in FIG. 2, a slightly doped region 104 is formed within the semiconductor substrate 100 on both sides of the gate structure by an ion implantation.

As shown in FIG. 3, a sidewall spacer 105 is formed on sidewalls of the gate structure. The gate structure and the sidewall spacer 105 are used as a mask to heavily dope regions in the semiconductor substrate 100 on both sides of the gate structure to form source/drain regions 106.

However, transistors fabricated by conventional methods have low carrier mobility in the channel region, which affects device performance. It is therefore desirable to provide transistors with improved performance and methods for forming such transistors.

BRIEF SUMMARY OF THE DISCLOSURE

According to various embodiments, there is provided a method for forming a transistor device. In this method, a confining layer can be formed on a semiconductor substrate to confine impurity ions diffused from the semiconductor substrate to the confining layer. An epitaxial silicon layer can then be formed on the confining layer, followed by forming a gate structure on the epitaxial silicon layer. A portion of the epitaxial silicon layer can be used as an intrinsic channel region. A source region and a drain region can be formed in portions of each of the epitaxial silicon layer, the confining layer, and the semiconductor substrate.

According to various embodiments, there is also provided a transistor device. The transistor device can include a confining layer disposed on a semiconductor substrate and configured to confine impurity ions diffused from the semiconductor substrate to the confining layer. An epitaxial silicon layer can be disposed on the confining layer and a gate structure can be disposed on the epitaxial silicon layer. A portion of the epitaxial silicon layer can include an intrinsic channel region. The transistor device can also include a source region and a drain region disposed in portions of each of the epitaxial silicon layer, the confining layer, and the semiconductor substrate.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

When forming conventional transistors, a heating treatment is performed after formation of source/drain regions by an ion implantation process in a semiconductor substrate. During this heating treatment, the implanted ions may be easily diffused into and further share the channel region for transferring carriers of the transistor device. This reduces carrier mobility in the channel region and thus affects device performance.

As disclosed herein, an exemplary transistor device can be formed by, e.g., first forming a confining layer on a semiconductor substrate and then forming an epitaxial silicon layer on the confining layer. The confining layer can be a semiconductor layer used to confine impurity ions such that these impurity ions implanted in adjacent regions or components (e.g., the semiconductor substrate) are confined to this confining layer and do not diffuse into undesired other regions or components (e.g., the epitaxial silicon layer).

In various embodiments, the epitaxial silicon layer can be intrinsic and can be used to form a channel region (e.g., an intrinsic channel region) of the transistor device. The underlying confining layer can be used to confine impurity ions, which are diffused from the semiconductor substrate during the heating process, to the confining layer. The impurity ions confined in the confining layer do not diffuse into the overlaying epitaxial silicon layer that includes the intrinsic channel region and will not share the intrinsic channel region for transferring carries. Carrier mobility in the intrinsic channel region can be improved. Further, the impurity ions confined in the confining layer can be used as carries when the transistor device is switched to an inversion mode.

Figure 1:
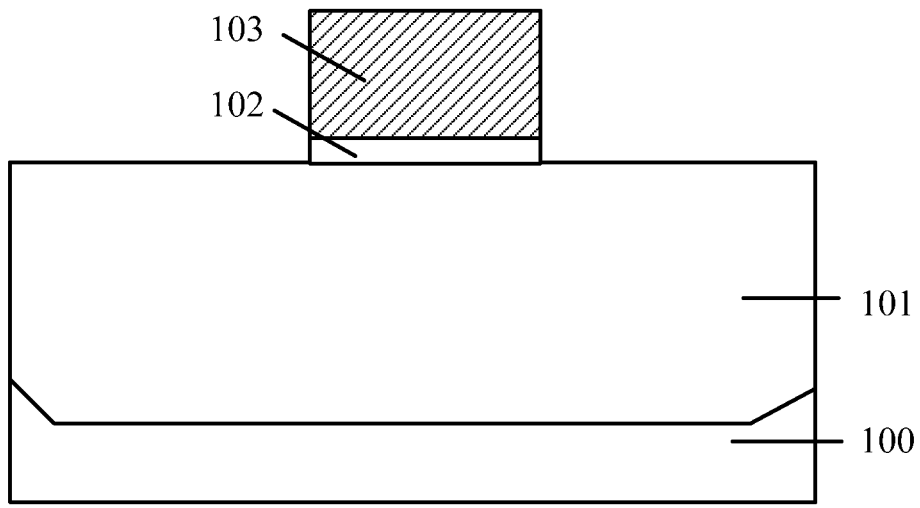
FIGS. 1-3 depict a conventional transistor at various stages during its formation.
Figure 2:
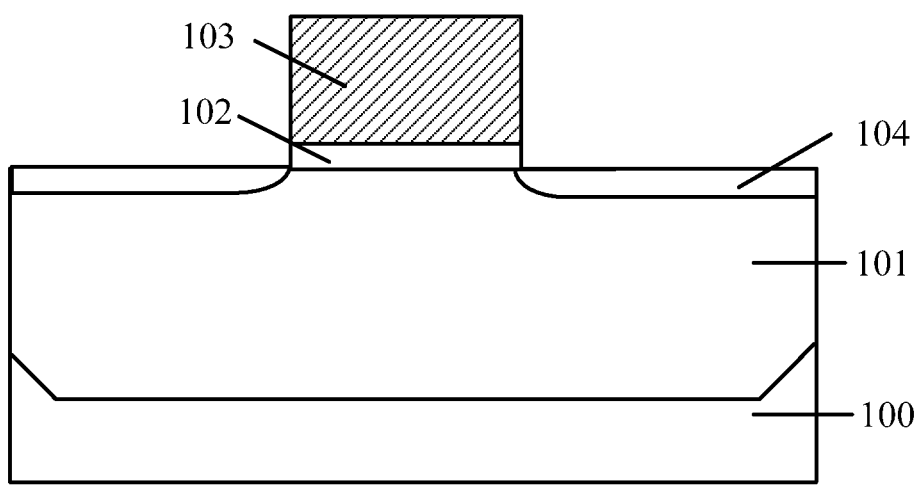
Figure 3:
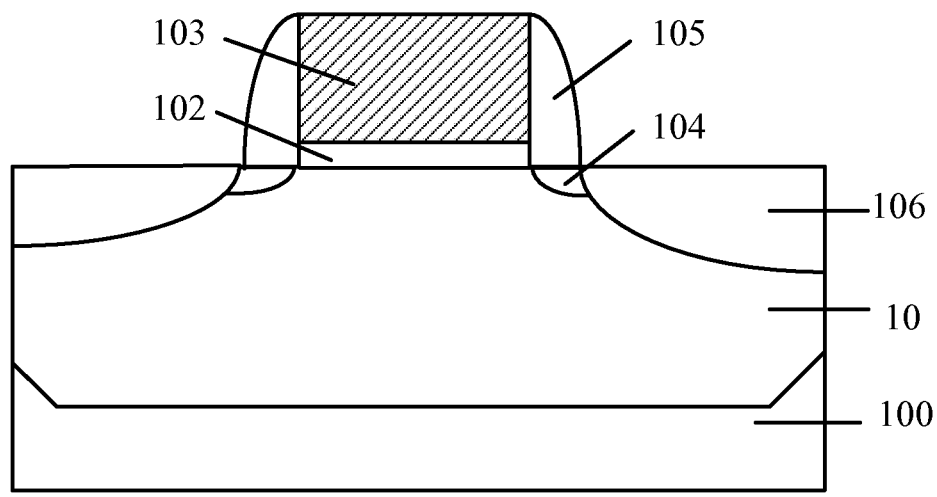
Figure 4:
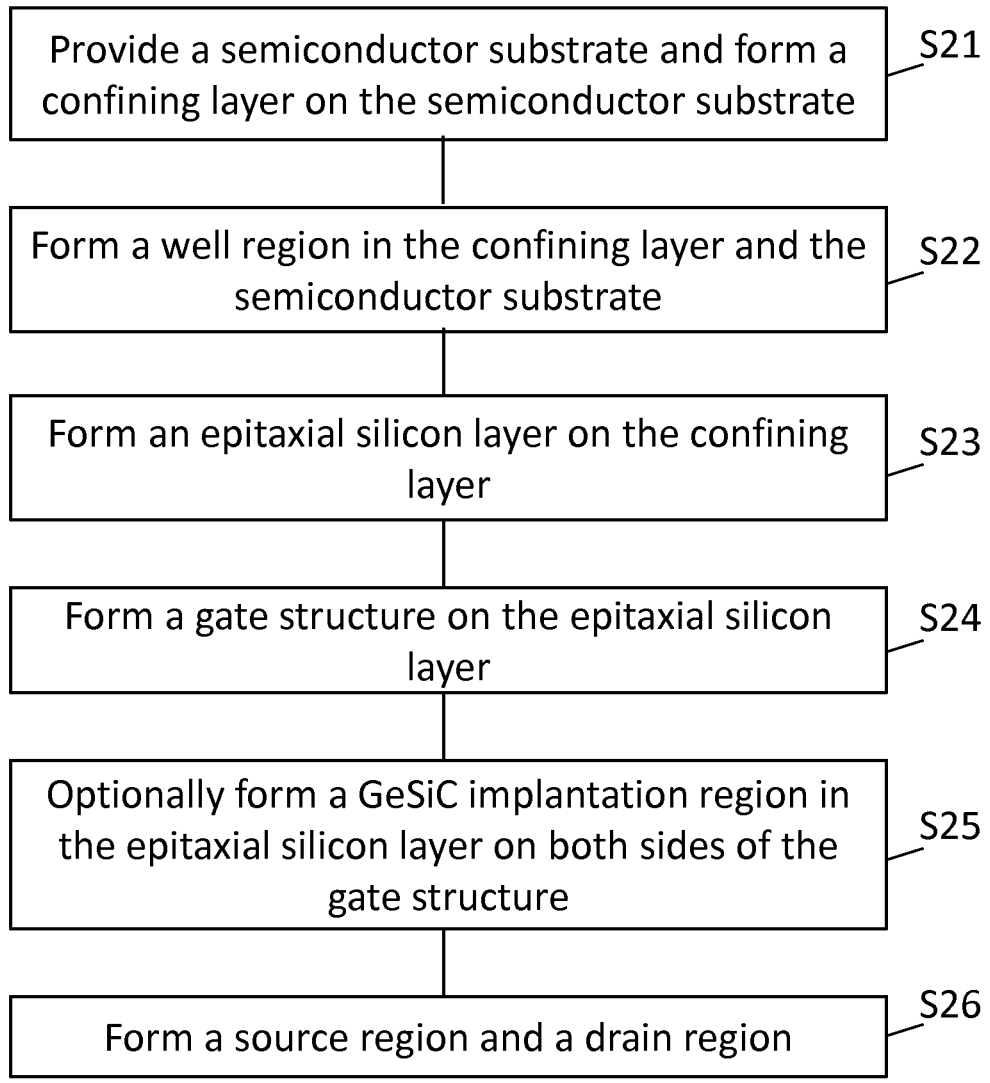
FIG. 4 depicts an exemplary method for forming a transistor device in accordance with various disclosed embodiments.

FIG. 4 depicts an exemplary method for forming an exemplary transistor device, and FIGS. 5-10 depict cross-sectional views of the transistor device at various stages during its formation as depicted in FIG. 4.

Figure 5:
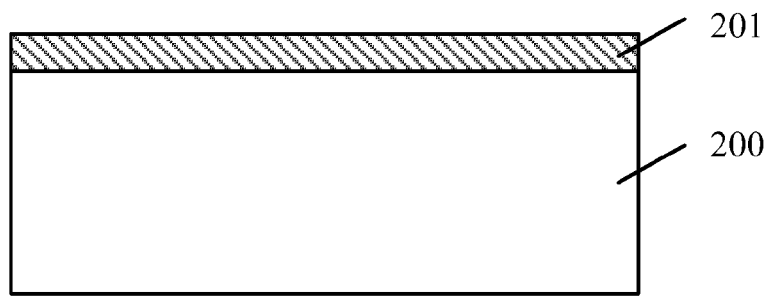
FIGS. 5-10 depict cross-sectional views of the transistor device at various stages during its formation as depicted in FIG. 4 in accordance with various disclosed embodiments.

At step S21 in FIG. 4 and referring to FIG. 5, a semiconductor substrate 200 can be provided. A confining layer 201 can be formed on the semiconductor substrate 200 to confine impurity ions, which are implanted in and then diffused from the semiconductor substrate 200, to the confining layer 201.

The semiconductor substrate 200 can be a substrate of, for example, single crystal silicon (Si), single crystal germanium (Ge), germanium-silicon (GeSi), silicon carbide (SiC), silicon on insulator (SOI), germanium on insulator (GOI), and/or Group III-V materials including, e.g., GaAs and/or InP.

The confining layer 201 can be a semiconductor layer having a single layer or multiple layers. In one embodiment, the confining layer 201 can be a single layer, for example, a germanium-silicon carbide (GeSiC) layer. In this example, the presence of germanium in the GeSiC layer can reduce diffusion speed of the impurity ions after an ion implantation in a well region of the semiconductor substrate 200. The presence of carbon in this GeSiC layer can allow formation of clusters with gap defects and thus avoid diffusion of the impurity ions due to increased distribution of the gap defects in the GeSiC layer. In this manner, the confining layer 201 can confine the impurity ions thereto, so that, when an epitaxial silicon layer is subsequently formed on the confining layer 201, the impurity ions implanted in the well region do not diffuse into the epitaxial silicon layer. The intrinsic channel region formed by the epitaxial silicon layer for transferring carriers will not be shared by the impurity ions, because the impurity ions are confined to the confining layer. Carrier mobility of the channel region can thus be improved. Meanwhile, the impurity ions confined to the confining layer 201 can be used as carriers when the transistor is switched to an inversion mode.

In some embodiments, the exemplary GeSiC layer can be formed by an in-situ doping epitaxial process to dope carbon ions in-situ in a germanium-silicon (GeSi) layer when the GeSi layer is being formed.

In other embodiments, the exemplary GeSiC layer can be formed by first using selective epitaxial processes to form a GeSi layer and then implanting carbon ions into the formed GeSi layer to form the GeSiC layer.

The confining layer 201 can have a thickness, e.g., ranging from about 50 nm to about 200 nm. The confining layer 201 can have, e.g., about 1% to about 10% molar percentage of carbon and about 3% to 40% molar percentage of germanium of the total confining layer. The confining layer can confine impurity ions thereto, and can also provide suitable stress in the intrinsic channel region in the subsequently-formed epitaxial silicon layer to improve carrier mobility of the transistor device.

Figure 6:
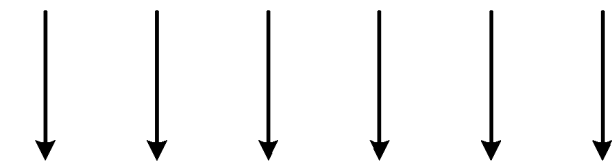
Figure 6:
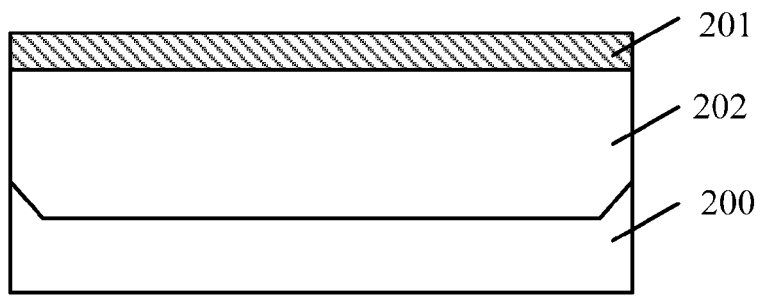

At step S22 in FIG. 4 and referring to FIG. 6, a well region 202 can be formed, e.g., by a first ion implantation, in the confining layer 201 and the semiconductor substrate 200.

The first ion implantation can implant N-type or P-type impurity ions. For example, for forming an NMOS transistor device, the impurity ions can be P-type and can include, e.g., boron ions, gallium ions, indium ions, and/or any combination(s) thereof. For forming a PMOS transistor device, the impurity ions can be N-type and include, e.g., phosphorous ions, arsenic ions, antimony ions, and/or any combination(s) thereof. For illustration purposes, the transistor device shown in FIGS. 5-10 is described as an NMOS transistor doped with P-type impurity ions in the well region 202. Of course, a PMOS transistor doped with N-type impurity ions in the well region can be encompassed herein according to various disclosed embodiments.

After the first ion implantation, the structure shown in FIG. 6 can be annealed to activate the implanted impurity ions. As the confining layer 201 is formed on the semiconductor substrate 200, the impurity ions implanted in the semiconductor substrate 200 can be diffused to the confining layer 201 when annealing. As discussed above, the confining layer 201 can confine the diffused impurity ions to remain in the confining layer 201.

Figure 7:
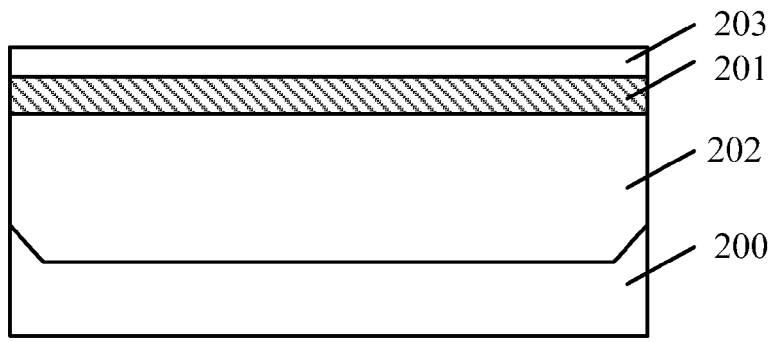

At step S23 in FIG. 4 and referring to FIG. 7, an epitaxial silicon layer 203 that is intrinsic can be formed on surface of the confining layer 201. As explained above, the confined impurity ions do not diffuse into the epitaxial silicon layer 203 including the intrinsic channel region of the transistor device, and carrier mobility of the transistor device can be improved.

In one embodiment, the epitaxial silicon layer 203 can include non-doped single crystal silicon. The epitaxial silicon layer 203 can have a suitable thickness, e.g., ranging from about 20 nm to about 50 nm. Such thickness can allow the intrinsic channel region to maintain a sufficient width and to reduce running time of the carriers when the transistor device is switched to an inversion mode, and further to increase the number of carriers.

After forming the epitaxial silicon layer 203, other processes may be performed including, for example, forming an isolation structure (not shown), e.g., an shallow trench isolation (STI), in the epitaxial silicon layer 203, the confining layer 201, and the semiconductor substrate 200 to electrically isolate adjacent active regions. The isolation structure can be made of an insulating material including, but not limited to, silicon oxide, silicon nitride, and/or silicon oxynitride.

Figure 8:
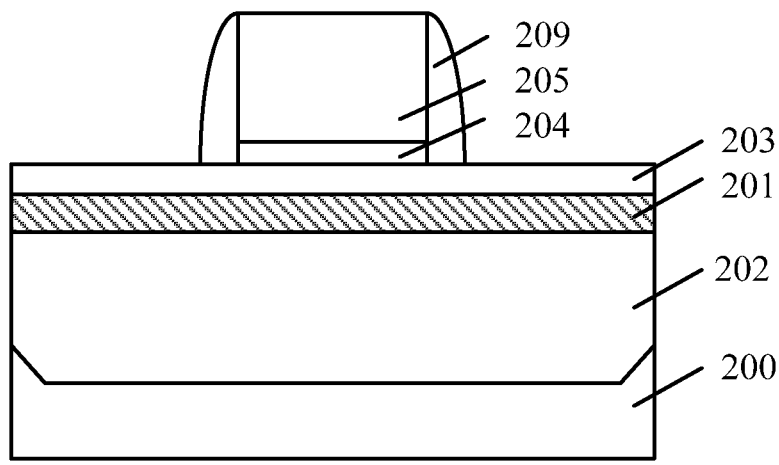

At step S24 in FIG. 4 and referring to FIG. 8, a gate structure can be formed on surface of the epitaxial silicon layer 203. The portion of the epitaxial silicon layer 203 associated with (e.g., underlying) the gate structure can be used as a channel region that is intrinsic.

The gate structure can include a gate dielectric layer 204 located on the intrinsic epitaxial silicon layer 203 and a gate electrode 205 located on the gate dielectric layer 204. The gate dielectric layer 204 can be made of a material including, e.g., silica, a high-k material, or any suitable dielectric material(s). The gate electrode 205 can be made of a material including, e.g., polysilicon, metal, or any suitable electrode material(s). In an exemplary embodiment, the gate dielectric layer 204 can be made of silica, and the gate electrode 205 can be made of polysilicon.

Following formation of the gate structure, other suitable processes may be performed including, for example, forming an offset sidewall spacer on the sidewalls of the gate structure; using the gate structure and the offset sidewall spacer as a mask to implant impurity ions in the epitaxial silicon layer 203 on both sides of gate structure to form shallow ion implantation region(s) (not shown) in the epitaxial silicon layer 203; and forming a main sidewall spacer on the offset sidewall spacer to form a sidewall spacer 209 including the offset sidewall spacer and the main sidewall spacer on the sidewalls of the gate structure.

In various embodiments, the offset sidewall spacer may be made of, for example, silicon oxide, and the main sidewall spacer may be made of, for example, silicon nitride. In various embodiments, the main sidewall spacer may be a layered structure including one or more layers made of silicon nitride and/or silicon oxide.

Figure 9:
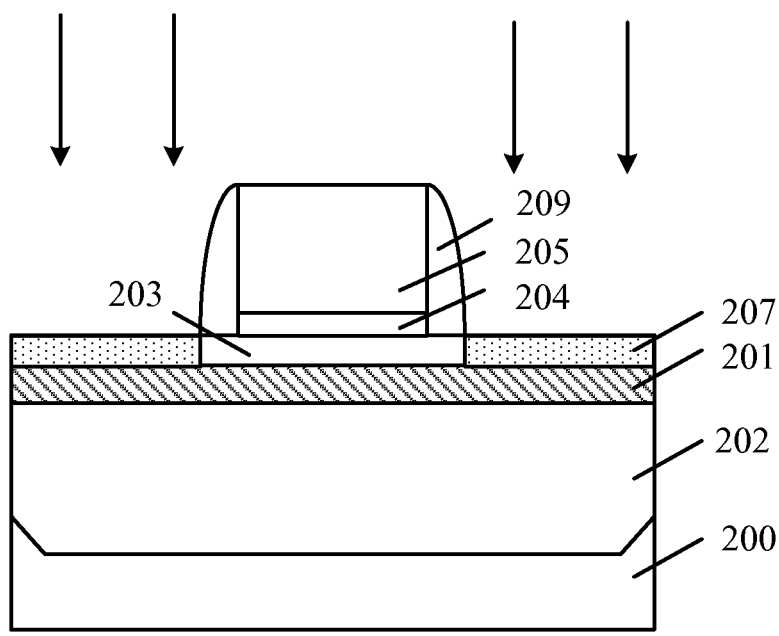

At step S25 in FIG. 4 and referring to FIG. 9, optionally, a germanium-silicon carbide (GeSiC) implantation region 207 may be formed on both sides of the gate structure, e.g., by ion implantation of germanium ions and carbon ions, in regions of the epitaxial silicon layer 203 covering the confining layer 201. In various embodiments, a mask layer can be formed on the gate structure to perform this ion implantation of germanium and carbon ions. After this ion implantation, other suitable processes may be performed including, for example, annealing the semiconductor substrate at an annealing temperature of, e.g., about 900° C. to about 1200° C., for an annealing time of, e.g., about 10 seconds to about 60 seconds.

Figure 10:
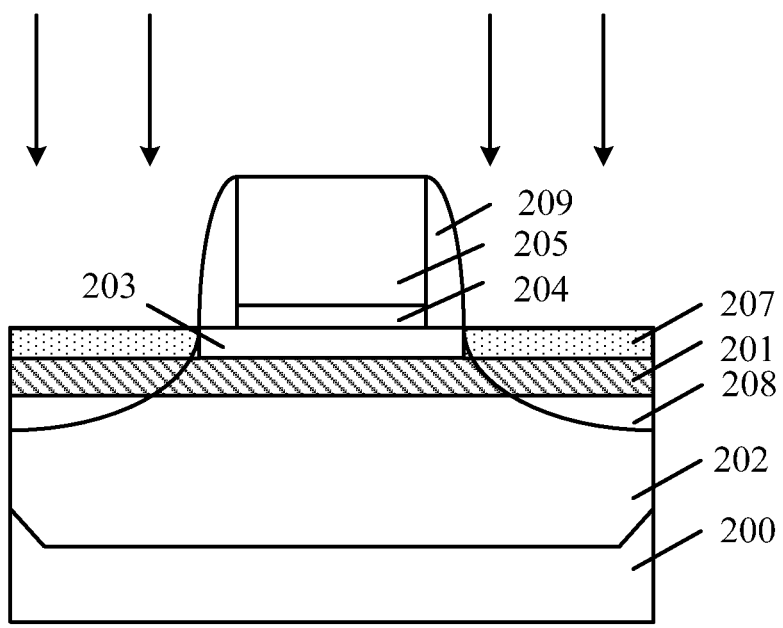

At step S26 in FIG. 4 and referring to FIG. 10, source/drain regions 208 can be formed on both sides of the gate structure, e.g., by a second ion implantation, in portions of each of the epitaxial silicon layer (e.g., the portion can be intrinsic or can be the optional GeSiC implantation region 207), the confining layer 201, and the semiconductor substrate 200. The previously formed GeSiC implantation region 207 can prevent impurity ions, implanted by the second ion implantation, from diffusing into the remaining intrinsic epitaxial silicon layer 203 located at the bottom of the gate structure. In other words, impurity ions implanted from the second ion implantation can be confined to the GeSiC implantation region 207 and will not share the intrinsic channel region (i.e., the remaining intrinsic epitaxial silicon layer 203 at the bottom of the gate structure as shown in FIG. 10) for transferring carriers. That is, source/drain regions 208 are formed vertically through/in the epitaxial silicon layer, the confining layer 201, and the semiconductor substrate 200. The confining layer 201 controls the distribution of impurity ions in the source/drain regions 208 to maintain the intrinsic channel region. Carrier mobility can then be improved.

In various embodiments, to form the source/drain region 208 as depicted in FIG. 10, a mask layer can be formed on the gate structure, followed by using this mask layer and the sidewall spacer 209 as a mask to perform the second ion implantation.

In one embodiment, the transistor device shown in FIGS. 5-10 is an NMOS transistor and the impurity ions implanted by the second ion implantation to form source/drain regions can be N-type impurity ions. The N-type impurity ions can include, but not be limited to, phosphorous ions, arsenic ions, antimony ions, and/or any combination(s) thereof. In other embodiments, the transistor device can be a PMOS transistor and impurity ions implanted by the second ion implantation to form source/drain regions can be P-type impurity ions. The P-type impurity ions can include, but not be limited to, boron ions, gallium ions, indium ions, and/or any combination(s) thereof.

After performing the second ion implantation to form source/drain regions, other suitable processes may be performed including, for example, annealing the semiconductor substrate to activate the implanted ions.

As such, the confining layer 201 (e.g., a GeSiC layer) can confine impurity ions implanted by the first ion implantation to form the well region 202 in the semiconductor substrate 200 to the confining layer 201, and can prevent impurity ions from diffusing toward the intrinsic epitaxial silicon layer 203 covering the confining layer 201 as shown in FIGS. 7-8. The GeSiC implantation region 207 and/or the confining layer 201 can confine impurity ions implanted by the second ion implantation to form source/drain regions 208 (e.g., in the semiconductor substrate 200, the confining layer 201, and the optional GeSiC implantation region 207) and can prevent impurity ions from diffusing toward the remaining intrinsic epitaxial silicon layer 203 (i.e., the intrinsic channel region) located at the bottom of (i.e., under) the gate structure as shown in FIG. 10. Carrier mobility of the intrinsic channel region can be improved.

The transistor device, e.g., as shown in FIG. 10, can thus include a semiconductor substrate 200 and a confining layer 201 on the semiconductor substrate 200. The confining layer 201 can be, e.g., a single layer including a germanium-silicon carbide layer. The transistor device can also include an intrinsic epitaxial silicon layer disposed on surface of the confining layer 201, and a GeSiC implantation region 207 formed within the intrinsic epitaxial silicon layer on both sides of the gate structure. The transistor device can further include a gate structure on the remaining intrinsic epitaxial silicon layer 203, and source/drain regions 208 located in associated portions of the epitaxial silicon layer (e.g., the portion can be intrinsic or can be the optional GeSiC implantation region 207), the confining layer 201, and the semiconductor substrate 200, which are on both sides of the gate structure.

Figure 11:
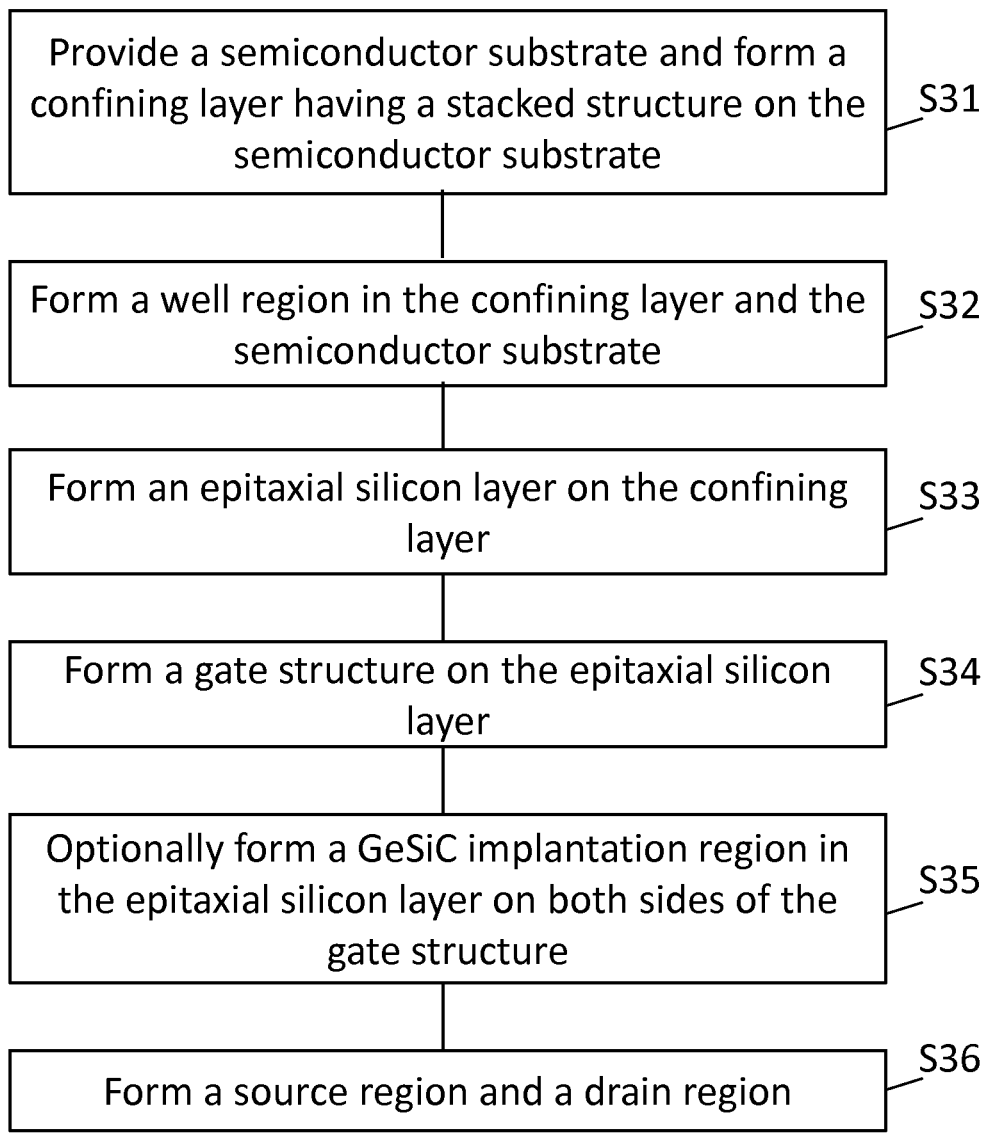
FIG. 11 depicts another exemplary method for forming a transistor device in accordance with various disclosed embodiments.

FIG. 11 depicts another exemplary method for forming an exemplary transistor device, and FIGS. 12-17 depict cross-sectional views of the transistor device at various stages during its formation as depicted in FIG. 11.

Figure 12:
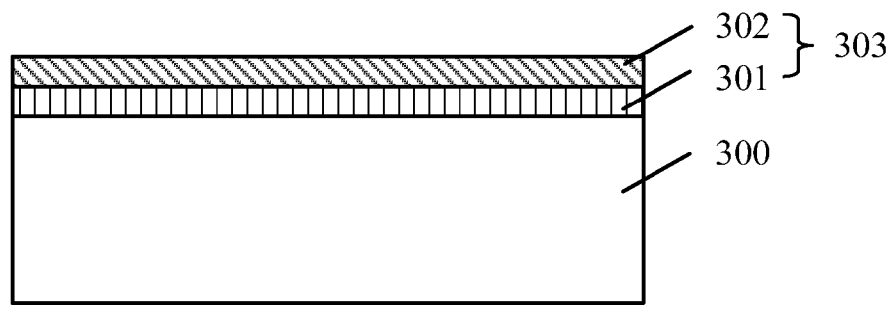
FIGS. 12-17 depict cross-sectional views of the transistor device at various stages during its formation as depicted in FIG. 11 in accordance with various disclosed embodiments.

At step S31 in FIG. 11 and referring to FIG. 12, a semiconductor substrate 300 can be provided. A confining layer 303 can be formed on the semiconductor substrate. The semiconductor substrate 300 can be the same as or different from the semiconductor substrate 200 as shown in FIGS. 5-10. The confining layer 303 can be a multi-layer, e.g., having a stacked structure. In one embodiment, the confining layer 303 can include a germanium-silicon (GeSi) layer 301 disposed on the semiconductor substrate 300 and a silicon carbide (SiC) layer 302 disposed on the GeSi layer 301. The confining layer 303 can be used to confine impurity ions diffused from the semiconductor substrate 300 to the confining layer 303.

Alternatively, the confining layer 303 can be a stacked structure, for example, including a silicon carbide (SiC) layer disposed on the semiconductor substrate and a germanium-silicon (GeSi) layer disposed on the silicon carbide (SiC) layer.

In various embodiments, the presence of germanium in the GeSi layer 301 of the confining layer 303 can reduce diffusion speed of impurity ions from a subsequently-formed well region and the presence of carbon in the SiC layer 302 can allow formation of clusters with gap defects and thus avoid diffusion of the impurity ions due to increased distribution of the gap defects in the confining layer. The confining layer 303 including the GeSi layer and the SiC layer can confine the impurity ions thereto, so that, when an intrinsic epitaxial silicon layer is subsequently formed on the confining layer 303, the impurity ions implanted in the well region do not diffuse into the intrinsic epitaxial silicon layer. The intrinsic channel region formed in the intrinsic epitaxial silicon layer for transferring carriers will not be shared by the impurity ions, because the impurity ions are confined to the confining layer. Carrier mobility of the intrinsic channel region can thus be improved. Meanwhile, the impurity ions confined to the confining layer 303 can be used as carriers when the transistor device is switched to an inversion mode.

The GeSi layer 301 can have, e.g., about 3% to about 40% molar percentage of germanium of the total GeSi layer. The SiC layer 302 can have, e.g., about 3% to 15% molar percentage of carbon of the total SiC layer. The GeSi layer 301 can have a thickness, e.g., ranging from about 10 nm to about 80 nm. The SiC layer 302 can have a thickness, e.g., ranging from about 10 nm to about 80 nm. In this manner, the confining layer having stacked structure can confine impurity ions thereto, and can also provide suitable stress in the channel region in the subsequently-formed intrinsic epitaxial silicon layer to improve carrier mobility of the transistor device.

In some embodiments, the GeSi layer 301 and the SiC layer 302 can be formed by epitaxial processes. In other embodiments, the SiC layer 302 can be formed by, for example, first forming an epitaxial silicon layer on surface of the GeSi layer and then implanting carbon ions into the formed epitaxial silicon layer to form the SiC layer.

Figure 13:
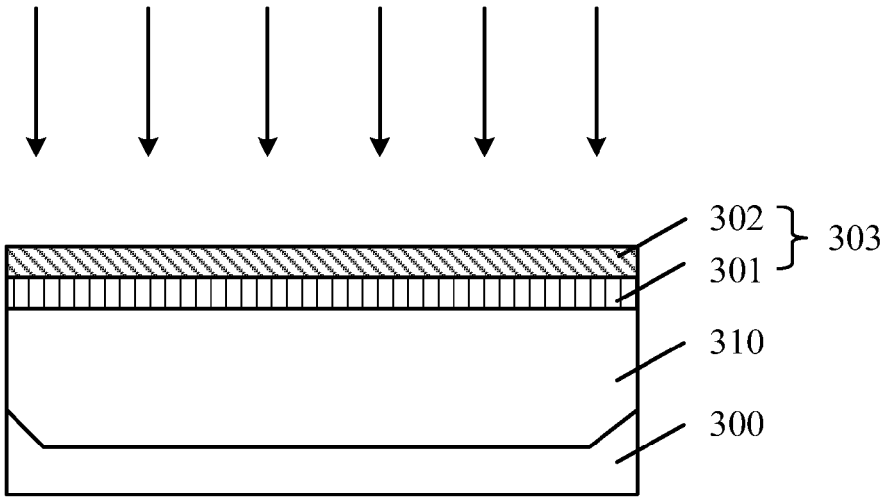

At step S32 in FIG. 11 and referring to FIG. 13, a well region 310 can be formed, e.g., by a first ion implantation, in the confining layer 303 and the semiconductor substrate 300.

The first ion implantation can implant N-type or P-type impurity ions. For example, for forming an NMOS transistor device, the impurity ions can be P-type and can include, e.g., boron ions, gallium ions, indium ions, and/or any combination(s) thereof. For forming a PMOS transistor device, the impurity ions can be N-type and include, e.g., phosphorous ions, arsenic ions, antimony ions, and/or any combination(s) thereof. For illustration purposes, the transistor device shown in FIGS. 12-17 is described as an NMOS transistor doped with P-type impurity ions in the well region 310. Of course, a PMOS transistor doped with N-type impurity ions in the well region can be encompassed herein according to various disclosed embodiments.

After the first ion implantation, the structure shown in FIG. 13 can be annealed to activate the implanted impurity ions. As the confining layer 303 is formed on the semiconductor substrate 300, the impurity ions implanted in the semiconductor substrate 300 can be diffused to the confining layer 303 when annealing. As discussed above, the confining layer 303 can confine the diffused impurity ions to remain in the layered stack of the confining layer 303.

Figure 14:
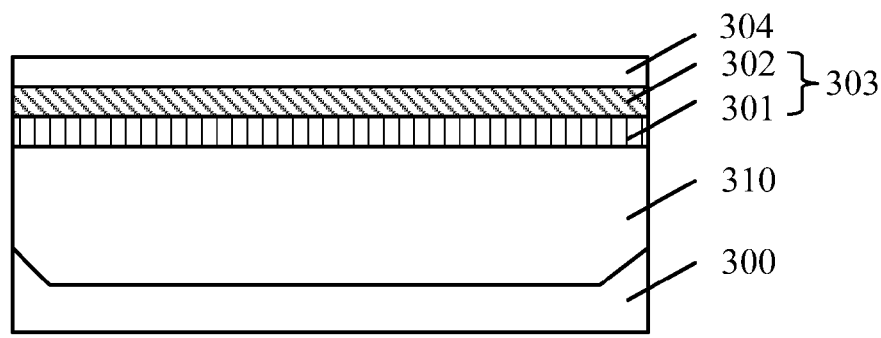

At step S33 in FIG. 11 and referring to FIG. 14, an epitaxial silicon layer 304 that is intrinsic can be formed on surface of the confining layer 303. As explained above, the confined impurity ions do not diffuse into the intrinsic epitaxial silicon layer 304 including the intrinsic channel region of the transistor device, and carrier mobility of the transistor device can be improved.

In one embodiment, the intrinsic epitaxial silicon layer 304 can include non-doped single crystal silicon. The intrinsic epitaxial silicon layer 304 can have a suitable thickness, e.g., ranging from about 20 nm to about 50 nm. Such thickness can allow the intrinsic channel region to maintain a sufficient width and to reduce running time of the carriers when the transistor device is switched to an inversion mode, and further to increase the number of carriers.

After forming the intrinsic epitaxial silicon layer 304, other processes may be performed including, for example, forming an isolation structure (not shown), e.g., an shallow trench isolation (STI), in the intrinsic epitaxial silicon layer 304, the confining layer 303, and the semiconductor substrate 300 to electrically isolate adjacent active regions. The isolation structure can be made of an insulating material including, but not limited to, silicon oxide, silicon nitride, and/or silicon oxynitride.

Figure 15:
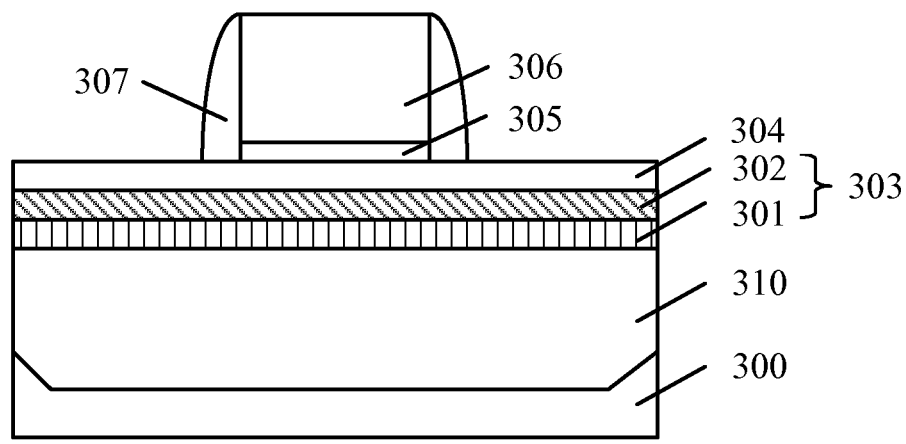

At step S34 in FIG. 11 and referring to FIG. 15, a gate structure can be formed on surface of the intrinsic epitaxial silicon layer 304. The portion of the intrinsic epitaxial silicon layer 304 associated with (e.g., underlying) the gate structure can be used as a channel region that is intrinsic.

The gate structure can include a gate dielectric layer 305 located on the intrinsic epitaxial silicon layer 304 and a gate electrode 306 located on the gate dielectric layer 305. The gate dielectric layer 305 can be made of a material including, e.g., silica, a high-k material, or any suitable dielectric material(s). The gate electrode 306 can be made of a material including, e.g., polysilicon, metal, or any suitable electrode material(s). In an exemplary embodiment, the gate dielectric layer 305 can be made of silica, and the gate electrode 306 can be made of polysilicon.

Following formation of the gate structure, other suitable processes may be performed including, for example, forming an offset sidewall spacer on the sidewalls of the gate structure; using the gate structure and the offset sidewall spacer as a mask to implant impurity ions in the intrinsic epitaxial silicon layer 304 on both sides of gate structure to form shallow ion implantation region(s) (not shown); and forming a main sidewall spacer on the offset sidewall spacer to form a sidewall spacer 307 including the offset sidewall spacer and the main sidewall spacer on the sidewalls of the gate structure.

In various embodiments, the offset sidewall spacer may be made of, for example, silicon oxide, and the main sidewall spacer may be made of, for example, silicon nitride. In various embodiments, the main sidewall spacer may be a layered structure including one or more layers made of silicon nitride and/or silicon oxide.

Figure 16:
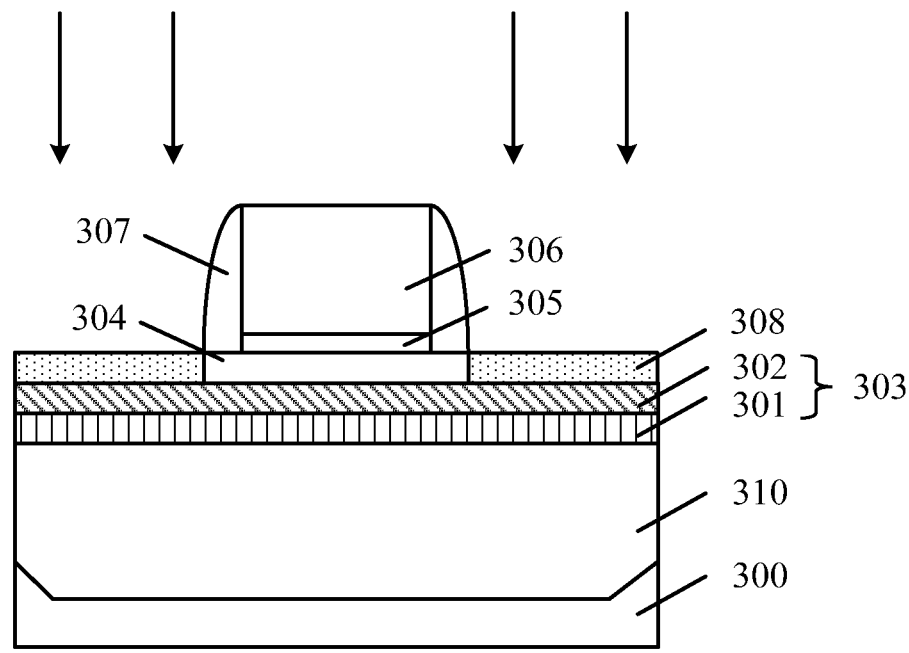

At step S35 in FIG. 11 and referring to FIG. 16, optionally, a germanium-silicon carbide (GeSiC) implantation region 308 can be formed on both sides of the gate structure, e.g., by ion implantation of germanium ions and carbon ions, in regions of the intrinsic epitaxial silicon layer covering the confining layer 303. In various embodiments, a mask layer can be formed on the gate structure to perform this ion implantation of germanium and carbon ions. After this ion implantation, other suitable processes may be performed including, for example, annealing the semiconductor substrate at an annealing temperature of, e.g., about 900° C. to about 1200° C., for an annealing time of, e.g., about 10 seconds to about 60 seconds.

Figure 17:
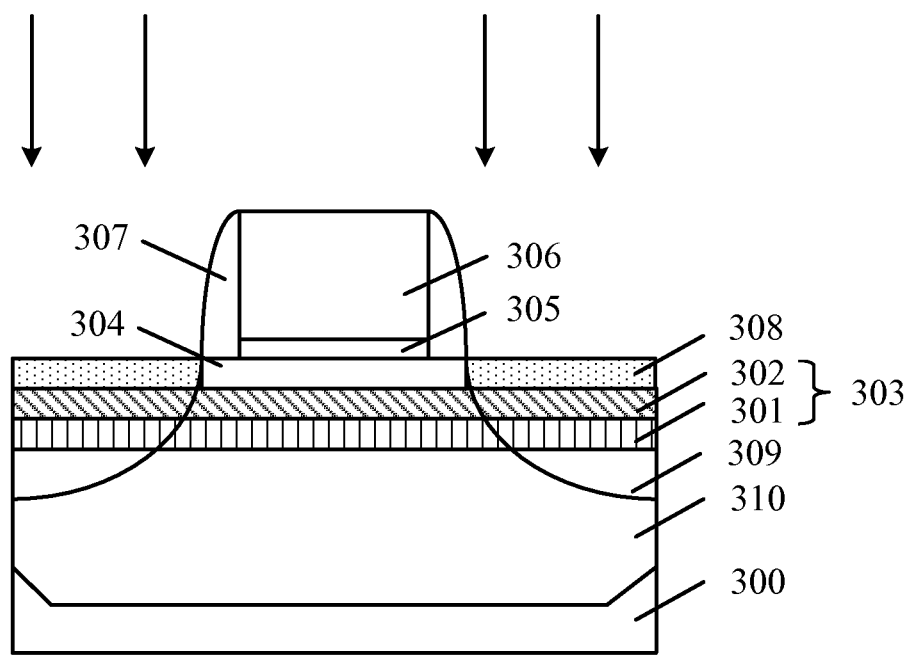

At step S36 in FIG. 11 and referring to FIG. 17, source/drain regions 309 can be formed on both sides of the gate structure, e.g., by a second ion implantation, in portions of the previously-formed epitaxial silicon layer (e.g., the portion can be intrinsic or can be the optional GeSiC implantation region 308), the confining layer 303, and the semiconductor substrate 300. In various embodiments, to form the source/drain regions 309 as depicted in FIG. 17, a mask layer can be formed on the gate structure, followed by using this mask layer and the sidewall spacer 307 as a mask to perform the second ion implantation.

In one embodiment, the transistor device shown in FIGS. 12-17 is an NMOS transistor and the impurity ions implanted by the second ion implantation to form the source/drain regions can be N-type impurity ions. The N-type impurity ions can include, but not be limited to, phosphorous ions, arsenic ions, antimony ions, and/or any combination(s) thereof. In other embodiments, the transistor device can be a PMOS transistor and impurity ions implanted by the second ion implantation to form the source/drain regions can be P-type impurity ions. The P-type impurity ions can include, but not be limited to, boron ions, gallium ions, indium ions, and/or any combination(s) thereof.

After performing the second ion implantation to form the source/drain regions, other suitable processes may be performed including, for example, annealing the semiconductor substrate to activate the implanted ions.

As such, the confining layer 303 can confine impurity ions implanted by the first ion implantation for forming the well region 310 in the semiconductor substrate 300 to the confining layer 303, and can prevent impurity ions from diffusing toward the intrinsic epitaxial silicon layer 304 covering the confining layer 303 as shown in FIGS. 14-15. The GeSiC implantation region 308 and/or the confining layer 303 can confine impurity ions implanted by the second ion implantation for forming source/drain regions 309 (e.g., in portions of the semiconductor substrate 300, the confining layer 303, and the GeSiC implantation region 308), and can prevent impurity ions from diffusing toward the remaining intrinsic epitaxial silicon layer 304 located at bottom of (i.e., under) the gate structure as shown in FIG. 17. Carrier mobility of the intrinsic channel region can be improved.

The transistor device, e.g., as shown in FIG. 17, can thus include a semiconductor substrate 300 and a confining layer 303 disposed on the semiconductor substrate 300. The confining layer 303 can be, e.g., a stacked structure including a GeSi layer 301 on the semiconductor substrate 300 and a SiC layer 302 on the GeSi layer 301. The transistor device can also include an intrinsic epitaxial silicon layer disposed on surface of the confining layer 303, and optionally a GeSiC implantation region 308 formed within the intrinsic epitaxial silicon layer on both sides of the gate structure. The transistor device can further include a gate structure disposed on the remaining intrinsic epitaxial silicon layer 304, and source/drain regions 309 formed in the associated portions of the epitaxial silicon layer (e.g., the portion can be intrinsic or can be the optional GeSiC implantation region 308), the confining layer 303, and the semiconductor substrate 300, which are on both sides of the gate structure.

Other applications, advantages, alternations, modifications, or equivalents to the disclosed embodiments are obvious to those skilled in the art.

What is claimed is:

1. A transistor device comprising:
   a semiconductor substrate;
   a confining layer disposed on the semiconductor substrate and configured to confine impurity ions diffused from the semiconductor substrate to the confining layer;
   a well region including the confining layer and a portion of the semiconductor substrate, wherein the well region is ion-implanted;
   an epitaxial silicon layer disposed on the confining layer that is ion implanted;
   a gate structure disposed on the epitaxial silicon layer, wherein a portion of the epitaxial silicon layer includes an intrinsic channel region;
   a germanium-silicon carbide (GeSiC) implantation region in the epitaxial silicon layer on both sides of the gate structure; and
   a source region and a drain region each including a portion of each of: the GeSiC implantation region in the epitaxial silicon layer, the ion-implanted confining layer, and the portion of the semiconductor substrate in the well region.

2. The device of claim 1, wherein the ion implanted confining layer is a single layer, the single layer including a germanium-silicon carbide (GeSiC) layer.

3. The device of claim 2, wherein the GeSiC layer includes carbon having a molar percentage of about 1% to about 10% of the total GeSiC layer, and germanium having a molar percentage of about 3% to about 40% of the total GeSiC layer.

4. The device of claim 1, wherein the ion implanted confining layer includes a stacked structure including a germanium-silicon (GeSi) layer and a silicon carbide (SiC) layer.

5. The device of claim 4, wherein the GeSi layer includes germanium having a molar percentage of about 3% to about 40% of the total GeSi layer, and the silicon carbide (SiC) layer includes carbon having a molar percentage of about 3% to about 15% of the total SiC layer.

6. The device of claim 1, wherein the epitaxial silicon layer has a thickness of about 20 nm to about 50 nm.

7. The device of claim 2, wherein the single layer including the GeSiC layer has a thickness of about 50 nm to about 200 nm.

8. The device of claim 5, wherein each of the germanium-silicon (GeSi) layer and the silicon carbide (SiC) layer has a thickness of about 10 nm to about 80 nm.

* * * * *